United States Patent
Worledge

(10) Patent No.: US 7,619,409 B2
(45) Date of Patent: Nov. 17, 2009

(54) METHODS AND APPARATUS FOR ELECTRICALLY CHARACTERIZING MAGNETIC TUNNEL JUNCTIONS HAVING THREE METAL LAYERS SEPARATED BY TWO DIELECTRIC LAYERS

(75) Inventor: Daniel Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 11/619,621

(22) Filed: Jan. 4, 2007

(65) Prior Publication Data

US 2008/0164872 A1    Jul. 10, 2008

(51) Int. Cl.
*G01R 33/12* (2006.01)
(52) U.S. Cl. .................. 324/230; 324/691; 324/719
(58) Field of Classification Search ................ 324/210, 324/230, 244, 252, 243, 249, 263, 691, 719
See application file for complete search history.

(56) References Cited

U.S. PATENT DOCUMENTS

| | | | |
|---|---|---|---|
| 6,538,430 B2 * | 3/2003 | Carrington et al. | .......... 324/210 |
| 6,927,569 B2 | 8/2005 | Worledge et al. | |
| 2004/0051522 A1 * | 3/2004 | Worledge et al. | ........... 324/230 |

* cited by examiner

*Primary Examiner*—Jay M Patidar
(74) *Attorney, Agent, or Firm*—Vazken Alexanian; Ryan, Mason & Lewis, LLP

(57) ABSTRACT

A method of electrically characterizing a magnetic tunnel junction film stack having three metal layers separated by two dielectric layers comprises three steps. In a first step, four or more probes are electrically coupled to a surface of the magnetic tunnel junction film stack. In a second step, electrical resistance is determined with the four or more probes for each of a plurality of spacings between the probes. Finally, in a third step, the plurality of resistance measurements are fitted with one or more equations that relate electrical resistance to probe spacing.

24 Claims, 4 Drawing Sheets

METHODS AND APPARATUS FOR ELECTRICALLY CHARACTERIZING MAGNETIC TUNNEL JUNCTIONS HAVING THREE METAL LAYERS SEPARATED BY TWO DIELECTRIC LAYERS

FIELD OF THE INVENTION

The present invention is directed to magnetic tunnel junctions, and, more particularly, to methods and apparatus for electrically characterizing magnetic tunnel junctions.

BACKGROUND OF THE INVENTION

Magnetoresistive random access memory (MRAM) utilizes magnetic tunnel junctions (MTJs) to store digital information. FIG. 1, for example, shows a typical MTJ 100. The MTJ is formed on a substrate 110 and comprises a bottom metal layer 120, a dielectric layer 130 and a top metal layer 140. Each of the metal layers is ferromagnetic and has an associated magnetic orientation. The bottom metal layer has a magnetic orientation which is fixed in given direction while the top metal layer is allowed to switch between two preferred orientations when exposed to an applied magnetic field. Writing digital information to the MTJ comprises applying a magnetic field to the MTJ in order to switch the magnetic orientation of the top metal layer between these two preferred directions.

In order to read the MTJ 100, electrons are made to tunnel through the dielectric layer 130 by applying a voltage to the MTJ and determining the electrical resistance of the dielectric layer. The resistance of the dielectric layer, in turn, depends on the relative magnetic orientations of the adjacent metal layers 120, 140. The resistance of the dielectric layer is relatively low when the magnetic orientations of the metal layers point in substantially the same direction. In contrast, the resistance of the dielectric layer is relatively high when the magnetic orientations of the metal layers point in opposite directions. The relative change in resistance is termed magnetoresistance (MR), and is expressed as a percentage change with respect to the lower resistance value.

It is often advantageous for a design or process engineer to electrically characterize an MTJ film stack in wafer form before the film stack is further processed into discrete MTJ devices like the MTJ 100. Conventional techniques for characterizing MTJ film stacks in wafer form, however, typically require extensive processing of the semiconductor wafer in order to measure a few characteristics of the MTJ film stack. For instance, it is often necessary to attach external leads to various metal layers in the MTJ film stack. This processing is time consuming, complex and can ruin devices. In addition, even if the additional processing creates suitable devices for test, it is frequently unclear whether the resultant measurements have been influenced by the added processing and structures. In other words, it is unclear as to whether the measurements are a function of the MTJ film stack itself, the processing that creates additional structures needed to make the measurements, the additional structures, or some combination thereof.

Fortunately, U.S. Pat. No. 6,927,569, co-invented by the inventor of the present invention and entitled "Techniques for Electrically Characterizing Tunnel Junction Film Stacks with Little or No Processing," provides methods for characterizing some kinds of MTJ film stacks without the need for extensive additional processing. These techniques utilize, in part, resistance measurements made via a multi-point probe apparatus capable of making voltage and current measurements with variable probe spacings. Advantageously, the sheet resistances of various constituent metal layers and the MR of the MTJ film stack's dielectric layer can be readily determined by these techniques.

Nevertheless, recently, it has become increasingly more popular to form MTJs with more than one dielectric layer. FIG. 2, for example, shows an illustration of a two-dielectric-layer MTJ 200. This MTJ is formed on a substrate 210 and comprises a bottom metal layer 220, a bottom dielectric layer 230, a middle metal layer 240, a top dielectric layer 250 and a top metal layer 260. As is typical in these types of devices, the top dielectric layer serves as a barrier for the interdiffusion of metallic elements while the bottom dielectric layer acts as the barrier layer wherein the magnetoresistance effects occur. It is, therefore, desirable to determine the MR for this bottom dielectric layer. Unfortunately, because of the presence of the second dielectric layer, the methods provided in the above-cited patent cannot be used. Consequently, the need exists for new techniques and apparatus that allow an MTJ film stack with two dielectric layers to be electrically characterized without requiring additional processing.

SUMMARY OF THE INVENTION

Aspects of the present invention address the above-identified needs by providing methods and apparatus allowing MTJ film stacks having two dielectric layers to be electrically characterized with little or no extra processing.

In accordance with an aspect of the invention, a method of electrically characterizing an MTJ film stack having three metal layers separated by two dielectric layers comprises three steps. In a first step, four or more probes are electrically coupled to a surface of the MTJ film stack. In a second step, electrical resistance is determined with the four or more probes for each of a plurality of spacings between the probes. Finally, in a third step, the plurality of resistance measurements are fitted with one or more equations that relate electrical resistance to probe spacing.

In accordance with an illustrative embodiment of the invention, an MTJ film stack under study comprises three metal layers divided by two dielectric layers. A four-point probe is utilized to determine resistances corresponding to the high and low memory states for the MTJ film stack for a variety of spacings between the probes. This data, in turn, is fit using a derived mathematical relationship between measured resistance at the four-point probe and probe spacings to determine a number of physical parameters for the MTJ film stack. The determined parameters include the sheet resistances of the metal layers and the MRs of the dielectric layers.

These and other features and advantages of the present invention will become apparent from the following detailed description which is to be read in conjunction with the accompanying drawings.

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

It should be noted that the term "metal layer" as used herein is intended to encompass any stratum of matter comprising at least one metallic element. A given metal layer need not be homogeneous, but, rather, may comprise a multiplicity of sublayers of differing compositions and/or functions.

Figure 1:
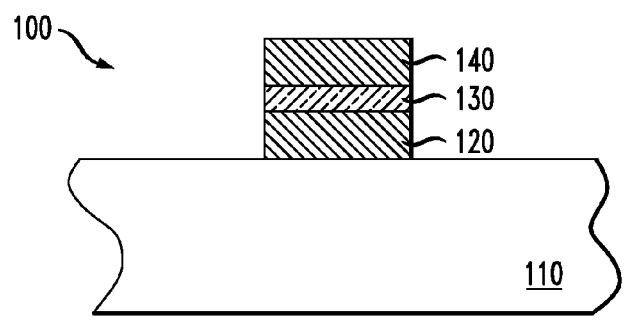
FIG. 1 shows a sectional view of an MTJ with a single dielectric layer.
Figure 2:
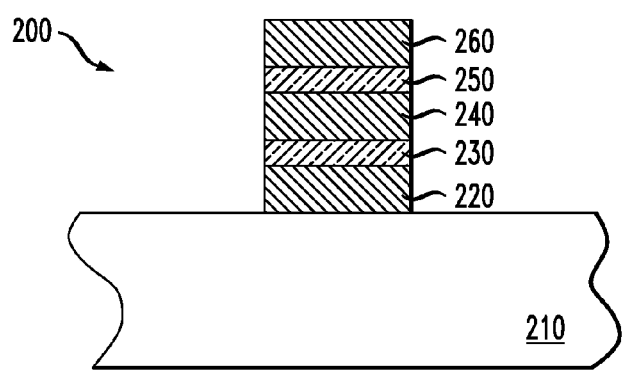
FIG. 2 shows a sectional view of an MTJ with two dielectric layers.
Figure 3:
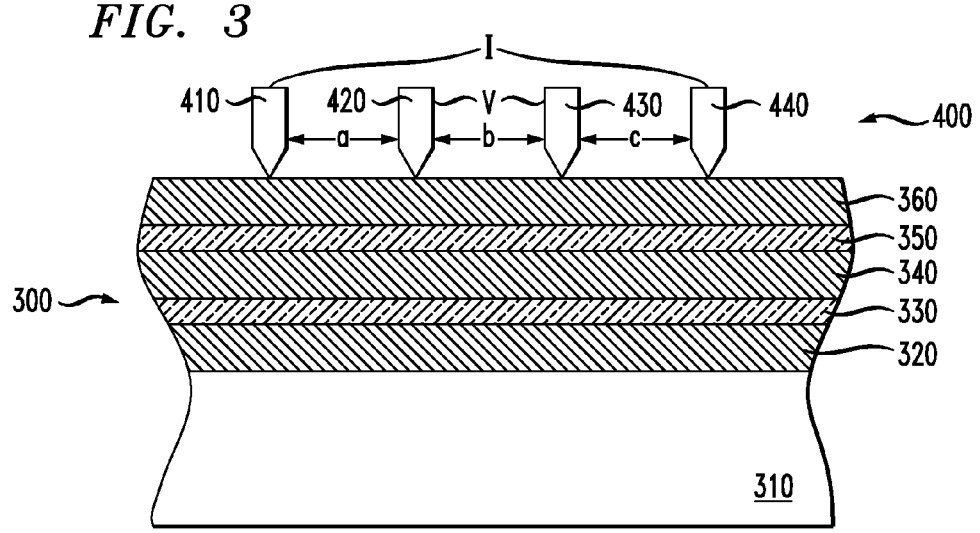
FIG. 3 shows a sectional view of an MTJ film stack and four-point probe in accordance with aspects of the invention.
Figure 4A:
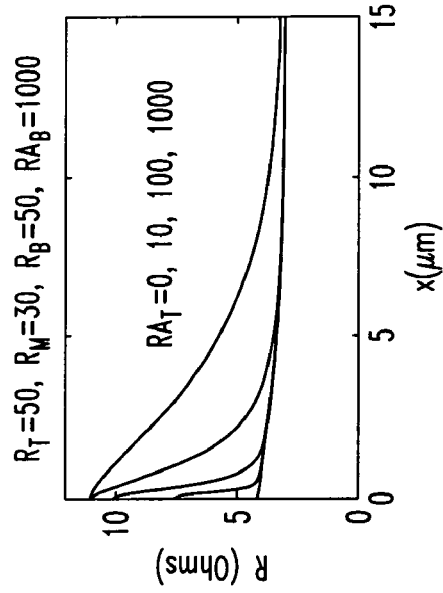
FIGS. 4A-4D show graphs of modeled resistance versus probe spacing for four MTJ film stacks with differing physical parameters.
Figure 4B:
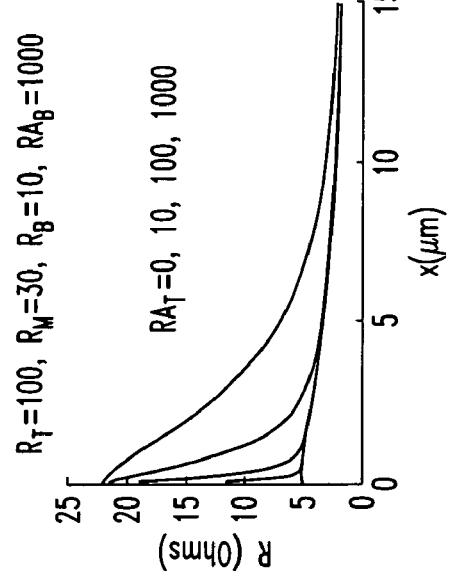
Figure 4C:
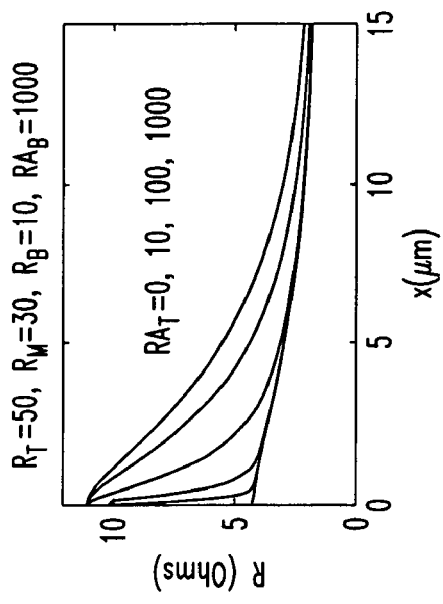
Figure 4D:
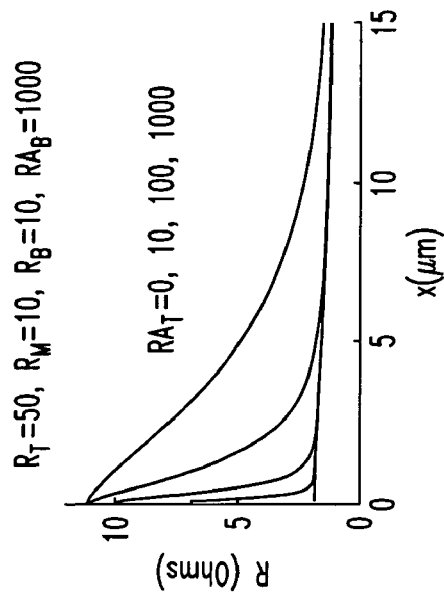

FIG. 3 shows an illustrative technique for characterizing an MTJ film stack 300 in accordance with aspects of the invention. The illustrative MTJ film stack comprises a substrate 310, a bottom metal layer 320, a bottom dielectric layer 330, a middle metal layer 340, a top dielectric layer 350 and a top metal layer 360. As is typical in these kinds of MTJ film stacks, both the bottom and middle metal layers are ferromagnetic. This means that they each exhibit an associated magnetic moment vector. The bottom metal layer is the "pinned layer," meaning that its associated magnetic moment vector is it not free to rotate in the presence of an applied magnetic field of a magnitude that would normally be generated in an MTJ. The middle metal layer, on the other hand, is the "free layer," meaning that its associated magnetic moment vector is free to rotate between two magnetic orientations in the presence of a modest magnetic field such as that which may be produced by flowing electrical currents in an integrated circuit. The orientation of the free magnetic moment vector within the middle layer thereby acts to establish the memory state of the MTJ for the purpose of storing digital information. The bottom dielectric layer 330 is disposed between the bottom and middle metal layers and therefore displays a resistance that depends on the relative magnetic orientations of these metal layers (i.e., the bottom dielectric layer displays a non-zero MR). The top dielectric layer 350, on the other hand, does not substantially feel the effects of the ferromagnetic metal layers. Rather, one of its purposes in the MTJ film stack is to act as a barrier to the diffusion of metallic elements.

FIG. 3, moreover, shows a four-point probe 400 that contacts the uppermost surface of the top metal layer 360. The four-point probe comprises probes 410, 420, 430 and 440 arranged in a line and separated from each other by distances a, b and c. In the particular embodiment shown in the figure, the leftmost probe 410 is used to inject current, I, into the MTJ film stack 300 and the rightmost probe 440 is used to collect this current after it passes through the film stack. The left-of-center probe 420 and the right-of-center probe 430 are used to measure voltage, V. A measured resistance can be determined by simply dividing the measured voltage by the magnitude of the injected current.

A four-point probe like the four-point probe 400 shown in FIG. 3 is a well known tool for characterizing many different types of materials. Such probes are frequently used, for example, to measure the resistivity of a material. Advantageously, the separation of current from voltage at the four probes acts to remove the effects of contact resistances on the resistivity measurements. This allows for a more accurate determination of material properties.

However, for MTJ film stacks like the MTJ film stack 300, conventional thought was that the current from a four-point probe was restricted to a surface region near the probe tips. As a result, it was assumed that the current never passed into those layers of the MTJ film stack beyond the uppermost metal layer 360. Accordingly, any researcher using commonly available probes (e.g., four-point probes) to attempt to characterize an MTJ film stack would determine that no useful data was obtained by these techniques.

Nevertheless, this conventional understanding is not accurate. When coupling a four-point probe to an MTJ film stack like the MTJ film stack 300, at least a portion of the probe current travels through all the layers of the MTJ film stack. As a result, the measured resistance at the probes is, in fact, a function of the electrical characteristics of all the layers within the MTJ film stack. Mathematically describing this flow of current produces mathematical expressions (i.e., equations) that allow many properties of the MTJ film stack to be characterized in a novel but relatively straightforward manner. Derivation of these equations is now described.

In the MTJ film stack and four-point probe arrangement shown in FIG. 3, the following expressions hold:

$$J_T'' + \frac{J_T'}{r} - \left[\frac{1}{r^2} + \frac{1}{\lambda_T^2}\right] J_T - \frac{R_M t_B}{RA_T t_T} J_B = -\frac{R_M I}{2\pi r RA_T t_T}$$

$$J_B'' + \frac{J_B'}{r} - \left[\frac{1}{r^2} + \frac{1}{\lambda_B^2}\right] J_B - \frac{R_M t_T}{RA_B t_B} J_T = -\frac{R_M I}{2\pi r RA_B t_B}$$

where: $J_T$ and $J_B$ are the current densities in the top and bottom metal layers, 360 and 320, respectively; r is the coordinate measuring the radius from the origin where the current I is injected; $t_T$, $t_M$, and $t_B$ are the thicknesses of the top, middle, and bottom metal layers, 360, 340 and 320, respectively; $R_T$, $R_M$, and $R_B$ are the resistances per square (i.e., sheet resistances) of the top, middle, and bottom metal layers, respectively; and $RA_T$ and $RA_B$ are the products of the resistances and areas of the top and bottom dielectric layers, respectively. Variables $\lambda_T$ and $\lambda_B$ are length scales associated with the top and bottom dielectric layers, respectively, defined by $$\lambda_T^2 = \frac{RA_T}{R_T + R_M}$$

$$\lambda_B^2 = \frac{RA_B}{R_B + R_M}.$$

These equations describe the flow of current injected at the origin into the top metal layer 360. The resistance measured at the four-point probe 400 can be derived by solving these equations for $J_T$, then converting $J_T$ to an electric field by multiplying by $R_T t_T$, and then integrating to get the voltage drop between the two voltage probes, 420, 430. The voltage drop due to the second current probe can be added in superposition. The resistance, R, measured at the four-point probe is then this voltage divided by the current. This procedure gives the following expression for resistance:

$$R = A_+ \left[ K_0\left(\frac{a}{\lambda_+}\right) - K_0\left(\frac{a+b}{\lambda_+}\right) + K_0\left(\frac{c}{\lambda_+}\right) - K_0\left(\frac{b+c}{\lambda_+}\right) \right] + \quad (1)$$

$$A_- \left[ K_0\left(\frac{a}{\lambda_-}\right) - K_0\left(\frac{a+b}{\lambda_-}\right) + K_0\left(\frac{c}{\lambda_-}\right) - K_0\left(\frac{b+c}{\lambda_-}\right) \right] +$$

$$\frac{R_T \| R_M \| R_B}{2\pi} \ln\left[\frac{(a+b)(b+c)}{ac}\right]$$

where the amplitudes are given by $$A_{\pm} = \pm \frac{\lambda_{\pm}^2 R_T^2}{2\pi R A_T} \frac{\frac{1}{\lambda_{\pm}^2} - \frac{1}{\lambda_T^2}}{\frac{1}{\lambda_{-}^2} - \frac{1}{\lambda_{+}^2}} \quad (2)$$

and the length scales are given by $$-\frac{1}{\lambda_{\pm}^2} = -\frac{1}{2}\left(\frac{1}{\lambda_T^2} + \frac{1}{\lambda_B^2}\right) \pm \frac{1}{2}\left[\left(\frac{1}{\lambda_T^2} - \frac{1}{\lambda_B^2}\right)^2 + \frac{4R_M^2}{RA_B RA_T}\right]^{1/2} \quad (3)$$

Here, a, b and c are the distances between adjacent probes, as shown in FIG. 3. The expression $R_T \| R_M \| R_B$ is short hand notation for the parallel combination of these resistances. $K_0$ is the modified Bessel function of the second kind of order zero.

It should be noted that equations (1)-(3) supply a mathematical relationship between measured resistance at the four-point probe 400 and probe spacings, a, b and c for the MTJ film stack 300. FIGS. 4A-4D illustrate this relationship for various values of $R_T$, $R_M$, $R_B$, $RA_T$ and $RA_B$ as a function of spacing x for equally spaced probes where x=a=b=c. $R_T$, $R_M$ and $R_B$ are in units of ohms (Ω), while $RA_T$ and $RA_B$ are in units of ohms-microns-microns (Ω-µm²). As can be seen in these figures, the curves show different slopes at small and large probe spacings which correspond to the different values of $RA_T$ and $RA_B$, respectively. For MTJ film stacks having parameters near the values represented in the graphs, little additional information is provided by a probe spacing, x, greater than about 10 µm.

Figure 5:
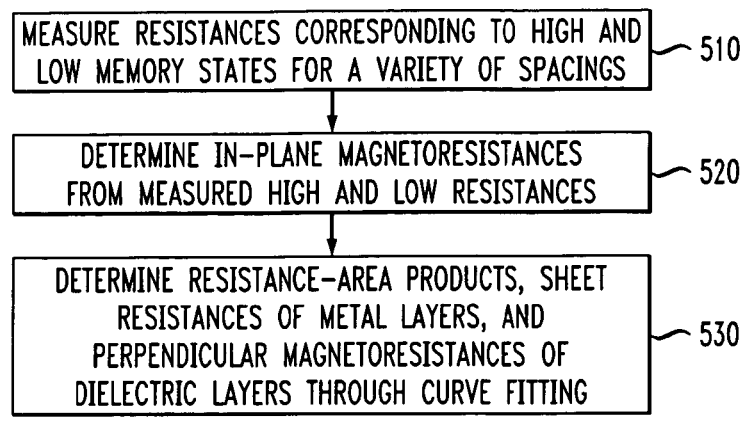
FIG. 5 shows a flow diagram of a method for characterizing an MTJ film stack in accordance with aspects of the invention.

FIG. 5 shows a method for characterizing MTJ film stacks using the equations described above. In step 510 a number of resistances are measured for the high and low memory states of the MTJ film stack at a variety of probe spacings. As described above, the high and low memory states correspond to the two different magnetic orientations of the free layer in the MTJ film stack.

There are a number of techniques for performing step 510. For instance, when using four-point probes, a selected four-point probe, having a selected spacing between probes, is placed in electrical contact with a surface of the MTJ film stack (e.g., the surface of the top metal layer), then current is passed between the two outer probes while the voltage is measured at the two inner probes. After making this measurement, a magnetic field, suitable to switch the magnetic orientation of the free layer is applied to the MTJ film stack. Then another current/voltage measurement is made with the same probe spacing. Subsequently, another four-point probe with a different probe spacing is selected and measurements are again taken at both magnetic orientations of the free layer. This process is repeated until a sufficient number of spacings have been tested.

It should be noted, however, that although the use of a four-point probe has been described up to this point, the invention is not limited to the use of a probe with just four probes. In other embodiments, a probe with greater than four probes may be used. For example, it may be desirable to use a multi-point probe with greater than four probes that has a variety of spacings between the probes and that allows current and voltage to be sent to or measured at any of the four probes for a given measurement. Such a probe would allow measurements at multiple probe spacings to be determined more expeditiously.

Subsequently, in step 520, measured in-plane MR is determined for each set of high and low resistances for each probe spacing. In-plane MR, $MR_{I-P}$, for a given probe spacing is simply:

$$MR_{I-P} = \frac{R_{HIGH} - R_{LOW}}{R_{LOW}}$$

where $R_{HIGH}$ and $R_{LOW}$ are the resistances measured for the two memory states of the MTJ film stack at the given probe spacing. It should be noted, however, that the in-plane MR is a interim result that is a function of the whole MTJ film stack and is not identical to a conventional MR value that characterizes a particular dielectric layer. For clarity, the latter type of MR will hereinafter be referred to as a "perpendicular" MR. The perpendicular MRs for the bottom and top dielectric layers, $MR_B$ and $MR_T$, respectively, are defined by:

$$MR_B = 100\% \times \frac{RA_{B,HIGH} - RA_{B,LOW}}{RA_{B,LOW}}$$

$$MR_T = 100\% \times \frac{RA_{T,HIGH} - RA_{T,LOW}}{RA_{T,LOW}}.$$

In step 530, curve fitting is performed. In this step, $RA_T$, $RA_B$, $R_T$, $R_M$, $R_B$, $MR_B$, and $MR_T$, are determined by using the measured resistances from both the high and low resistance data and by using iterative curve fitting techniques. In other words, the fitting may be performed by assuming values for these variables and then calculating resistance and in-plane MR curves using equations (1)-(3) above. The values of the modeled resistance and in-plane MR curves are then compared with the measured values of the corresponding curves from steps 510 and 520. This process is then iterated several times, each time changing values for the $RA_T$, $RA_B$, $R_T$, $R_M$, $R_B$, $MR_B$ and $MR_T$ until the best agreement between the modeled and measured values of resistance and in-plane MR is obtained.

Of course, if anything is known about one of the metal layers or dielectric layers in the MTJ film stack under study, the variables characterizing that layer may be constrained during the curve fitting, both speeding up the iterative process and possibly leading to more accurate results. For example, if it is known that the top dielectric layer is simply a diffusion barrier, $MR_T$ may be set to zero since such a layer would not be expected to exhibit a perpendicular MR. Alternatively, if nothing is known the MTJ film stack, the entire ensemble of variables may be allowed to float within physically reasonable limits.

Figure 6A:
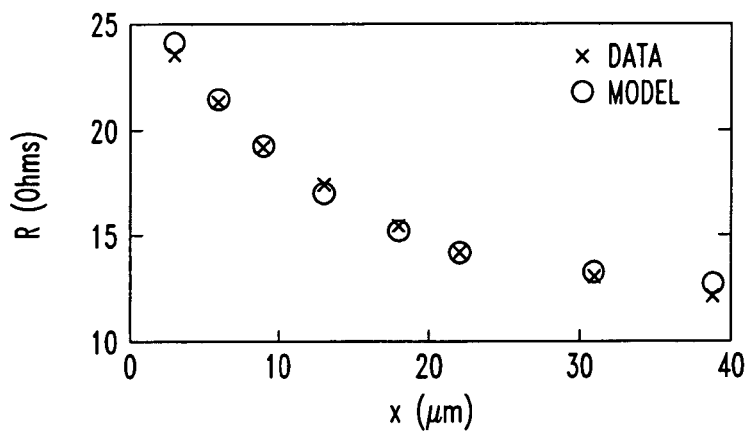
FIGS. 6A and 6B show determined and fitted data obtained by the FIG. 5 method for an illustrative MTJ film stack.
Figure 6B:
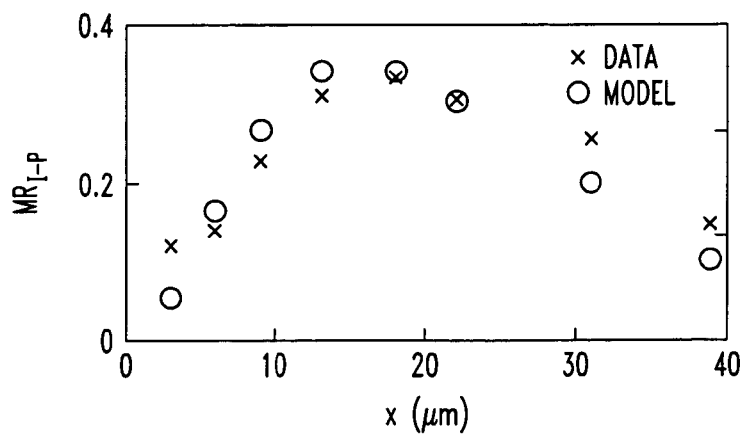

FIGS. 6A and 6B show the results of the application of the method described in FIG. 5 to a real MTJ film stack comprising three metal layers separated by two dielectric layers. FIG. 6A shows resistance versus mean probe spacing while FIG. 6B shows in-line MR versus mean probe spacing. A four point probe with equal but variable spacings between the probes was utilized for the measurements. Eight measurements were taken with probe spacings varying from about 2 to about 40 µm. A very good fit between the modeled and determined resistance and in-plane MR curves was obtained when $RA_T$=5000 Ω-µm², $RA_B$=700 Ω-µm², $R_T$=26 Ω, $R_M$=65 Ω, $R_B$=38 Ω, $MR_B$=40%, and $MR_T$=0%. Notably, these values are very close to what was expected for the MTJ film stack under study. Thus, methods in accordance with aspects of this invention allow a great deal to be learned about an MTJ film stack with little or no additional processing.

In fact, the above-described method is very useful in determining whether an unknown MTJ film stack does in actuality comprise three metal layers separated by two dielectric layers. If the above method is applied to a sample with these constituent layers, the characterization results will comprise physically plausible values. If, on the other hand, the sample is configured in some other way, due to, for example, a processing error, the characterization results will comprise physically implausible values (e.g., MRs for the dielectric layers near zero). As a result, the above-described method, may be utilized to flag non-conforming MTJ film stacks in a relatively quick and simple manner.

Figure 7:
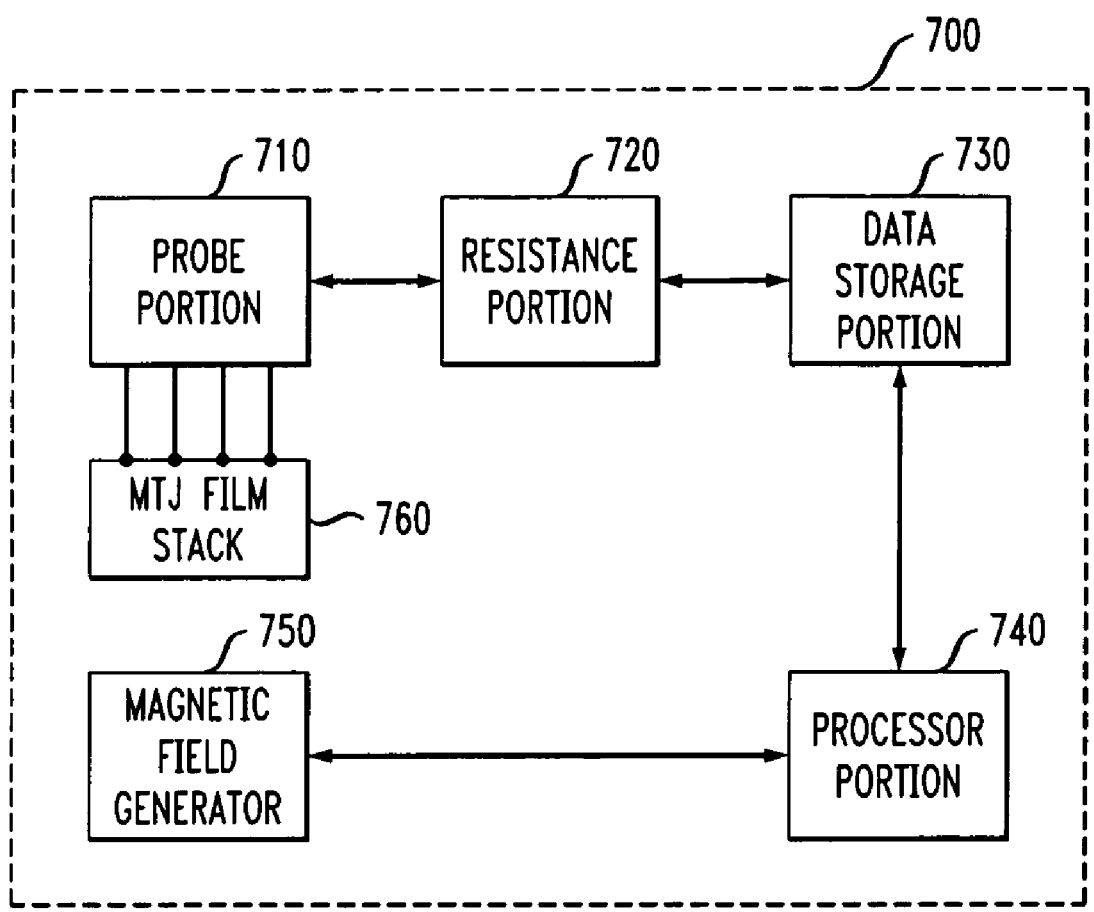
FIG. 7 shows a block diagram of an apparatus for characterizing an MTJ film stack in accordance with aspects of the invention.

FIG. 7 shows an illustrative apparatus 700 that is suitable for characterizing an MTJ film stack in accordance with the present invention. The apparatus comprises a probe portion 710, a resistance portion 720, a data storage portion 730, a processor portion 740 and a magnetic field generator 750. These elements may form discrete physical elements in the apparatus or, alternatively, two or more of these elements may be integrated into a single device. For example, the resistance portion, data storage portion and processor portion may, in certain circumstances, be formed into a single integrated circuit. All of these possible arrangements are contemplated and would come within the scope of the invention.

The apparatus preferably functions by following the method steps shown in FIG. 5. The probe portion 710 and resistance portion 720, for example, measure resistances corresponding to the high and low memory states of an MTJ film stack 760 for a variety of probe spacings. When necessary, the memory state of the MTJ film stack is modified by applying an external magnetic field to the MTJ film stack with the magnetic field generator 750. The resistance versus probe spacing data is stored in the data storage portion 730. Concurrently or subsequently, the processor portion 740 determines $RA_T$, $RA_B$, $R_T$, $R_M$, $R_B$, $MR_B$, and $MR_T$ for the MTJ film stack using curve fitting.

It may be preferable that the apparatus 700 operate in an automated manner that limits the required intervention of a human operator. Accordingly, the probe portion 710 preferably is able to change the spacings between the probes in an automated way. The probe portion, may, for example, be controlled by the processor portion 740 and use piezoelectric devices to mechanically change the spacings between probes. Alternatively, the probe portion may comprise a multi-point probe having greater than four probes with various spacings, as discussed earlier. The magnetic field generator 750, moreover, may also be controlled by the processing portion and made to change the magnetic polarization state of the MTJ film stack 760 at the appropriate times within the characterization process.

It should be emphasized that, although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method of electrically characterizing a magnetic tunnel junction film stack having three metal layers separated by two dielectric layers, the method comprising the steps of:

electrically coupling four or more probes to a surface of the magnetic tunnel junction film stack;

determining electrical resistance with the four or more probes for each of a plurality of spacings between the probes; and fitting the plurality of resistance measurements with one or more equations that relate electrical resistance to probe spacing.

2. The method of claim 1 wherein the step of electrically coupling four or more probes to a surface of the magnetic tunnel junction film stack comprises electrically coupling four probes to the surface.

3. The method of claim 2, wherein the probes are arranged in substantially a line when the probes are electrically coupled to the surface.

4. The method of claim 2, wherein two of the four probes apply current to the surface and the remaining two probes measure voltage at the surface.

5. The method of claim 2, wherein the four probes are equally distanced from each other when the probes are electrically coupled to the surface.

6. The method of claim 1, wherein the spacing between the two closest probes of the four or more probes is less than about 10 micrometers when the probes are electrically coupled to the surface.

7. The method of claim 1, farther comprising the step of applying a magnetic field to the magnetic tunnel junction film stack.

8. The method of claim 7, wherein the magnetic field switches at least one of the metal layers in the magnetic tunnel junction film stack between two preferred magnetic orientations.

9. The method of claim 1, wherein the method is operative to determine a product of resistance and area for at least one of the dielectric layers.

10. The method of claim 1, wherein the method is operative to determine a magnetoresistance for at least one of the dielectric layers.

11. The method of claim 1, wherein the method is operative to determine a sheet resistance for at least one of the metal layers.

12. The method of claim 1, wherein the one or more equations comprises one or more Bessel functions.

13. The method of claim 12, wherein at least one of the one or more Bessel functions is a modified Bessel function of a second kind of order zero.

14. The method of claim 1, wherein the step of fitting the plurality of resistance measurements is performed iteratively.

15. The method of claim 1, wherein at least one of the one or more equations is of a form:

$$R = A_+ \left[ K_0\left(\frac{a}{\lambda_+}\right) - K_0\left(\frac{a+b}{\lambda_+}\right) + K_0\left(\frac{c}{\lambda_+}\right) - K_0\left(\frac{b+c}{\lambda_+}\right) \right] +$$
$$A_- \left[ K_0\left(\frac{a}{\lambda_-}\right) - K_0\left(\frac{a+b}{\lambda_-}\right) + K_0\left(\frac{c}{\lambda_-}\right) - K_0\left(\frac{b+c}{\lambda_-}\right) \right] +$$
$$\frac{R_T \| R_M \| R_B}{2\pi} \ln\left[\frac{(a+b)(b+c)}{ac}\right]$$

where a, b and c represent respective ones of the plurality of spacings between the probes;

where $R_T \| R_M \| R_B$ represents a parallel combination of respective sheet resistances of the three metal layers; and where $A_+$ and $A_-$ represent amplitudes and where $\lambda_+$ and $\lambda_-$ represent length scales.

16. The method of claim 15, wherein $K_0$ is a modified Bessel function of a second kind of order zero.

17. The method of claim 15, wherein:

$$A_+ = \pm \frac{\lambda_\pm^2 R_T^2}{2\pi RA_T} \frac{\frac{1}{\lambda_\mp^2} - \frac{1}{\lambda_T^2}}{\frac{1}{\lambda_-^2} - \frac{1}{\lambda_+^2}} \text{ and } -\frac{1}{\lambda_\pm^2} =$$

$$-\frac{1}{2}\left(\frac{1}{\lambda_T^2} + \frac{1}{\lambda_B^2}\right) \pm \frac{1}{2}\left[\left(\frac{1}{\lambda_T^2} - \frac{1}{\lambda_B^2}\right)^2 + \frac{4R_M^2}{RA_B RA_T}\right]^{1/2}$$

where $R_T$ is a sheet resistance of a first one of the three metal layers;
where $R_M$ is a sheet resistance of a second one of the three metal layers;
where $R_B$ is a sheet resistances of a third one of the three metal layers;
where $RA_T$ is a product of resistance and area for a first one of the two dielectric layers;
where $RA_B$ is a product of resistance and area for a second one of the two dielectric layers;
where $\lambda_T$ is a length scale associated with the first one of the two dielectric layers; and
where $\lambda_B$ is a length scale associated with the second one of the two dielectric layers.

18. The method of claim 17, wherein $$\lambda_T^2 = \frac{RA_T}{R_T + R_M}$$

$$\lambda_B^2 = \frac{RA_B}{R_B + R_M}.$$

19. A method of determining whether a magnetic tunnel junction film stack has three metal layers separated by two dielectric layers, the method comprising the steps of:

electrically coupling four or more probes to a surface of the magnetic tunnel junction film stack;
determining electrical resistance with the four or more probes for each of a plurality of spacings between the probes; and
fitting the plurality of resistance measurements with one or more equations that relate electrical resistance to probe spacing.

20. An apparatus for characterizing a magnetic tunnel junction film stack having three metal layers separated by two dielectric layers, the apparatus comprising:
a probe portion, the probe portion operative to electrically couple four or more probes to a surface of the magnetic tunnel junction film stack;
a resistor portion, the resistor portion operative to determine electrical resistance with the four or more probes for each of a plurality of spacings between the probes; and
a processor portion, the processor portion operative to fit the plurality of resistance measurements with one or more equations that relate electrical resistance to probe spacing.

21. The apparatus of claim 20, further comprising a magnetic field generator portion operative to apply a magnetic field to the magnetic tunnel junction film stack.

22. The apparatus of claim 21, wherein the magnetic field is operative to switch at least one of the metal layers in the magnetic tunnel junction film stack between two preferred magnetic orientations.

23. The apparatus of claim 20, wherein the apparatus is operative to determine a magnetoresistance for at least one of the dielectric layers.

24. The apparatus of claim 20, wherein the apparatus is operative to determine a sheet resistance for at least one of the metal layers.

* * * * *